US012586885B2

(12) United States Patent
    Burdick

(10) Patent No.: US 12,586,885 B2
(45) Date of Patent: Mar. 24, 2026

(54) MULTILAYER RADIO FREQUENCY COMPONENT

(71) Applicant: Knowles Cazenovia, Inc., Cazenovia, NY (US)

(72) Inventor: Jared P. Burdick, Fayetteville, NY (US)

(73) Assignee: Knowles Cazenovia, Inc., Cazenovia, NY (US)

( * ) Notice: Subject to any disclaimer, the term of this patent is extended or adjusted under 35 U.S.C. 154(b) by 255 days.

(21) Appl. No.: 18/377,310

(22) Filed: Oct. 6, 2023

(65) Prior Publication Data

US 2025/0118881 A1      Apr. 10, 2025

(51) Int. Cl.
    *H01P 3/08*        (2006.01)
    *H05K 1/02*        (2006.01)
    *H05K 1/11*        (2006.01)

(52) U.S. Cl.
    CPC ........... *H01P 3/088* (2013.01); *H05K 1/0243* (2013.01); *H05K 1/115* (2013.01); *H05K 2201/09509* (2013.01)

(58) Field of Classification Search
    CPC .. H01P 3/08; H01P 3/085; H01P 5/107; H01P 11/003; H01P 5/184; H01P 3/006; H01P 3/082; H01P 3/081; H01P 5/12; H01P 1/203; H01P 3/088; H01P 1/20; H01P 1/2133; H01P 3/121; H01P 5/00; H01P 5/028; H01P 5/181; H01P 5/182; H01P 5/183; H01P 5/188; H01P 5/20; H01P 1/04; H01P 1/185; H01P 1/20372; H01P 1/2088; H01P 1/36; H01P 1/387; H01P 3/16; H01P 5/085; H01P 5/185; H01P 5/187; H01P 1/02; H01P 1/184; H01P 5/022; H01P 5/10; H01P 5/16; H01P 5/22; H05K 1/0218; H05K 1/186; H05K 2201/0723; H05K 2201/10098; H05K 1/115; H05K 2201/093; H05K 3/429; H05K 3/4614; H05K 1/0222; H05K 1/0251; H05K 2201/09609;
(Continued)

(56)      References Cited

U.S. PATENT DOCUMENTS 7,449,980 B2    11/2008  Bates
7,663,454 B2     2/2010  Bates
                (Continued)

OTHER PUBLICATIONS

Bates, U.S. Appl. No. 18/138,317, U.S. Patent and Trademark Office, Apr. 24, 2023.

*Primary Examiner* — John W Poos
(74) *Attorney, Agent, or Firm* — Hickman Becker Bingham Ledesma LLP; Matthew Loppnow

(57)        ABSTRACT

A radio frequency (RF) component having a compact form-factor includes a planar transmission line located between first and second dielectric substrates. A first plurality of conductive vias integrated with the first substrate are electrically connected to a second plurality of conductive vias integrated with the second substrate, wherein the electrically connected conductive vias are arranged at least partially about the planar transmission line. The vias are connected to a ground plane on one of the substrates. Multiple RF components can be stacked one atop the other to form an integrated bank of discrete or electrically connected electrical devices implemented as antennas, couplers and filters, among other RF components, and combinations thereof.

20 Claims, 7 Drawing Sheets

(58) Field of Classification Search

CPC ......... H05K 2201/0979; H05K 1/0219; H05K 1/0224; H05K 1/0237; H05K 1/0243; H05K 2201/09854; H05K 3/0044; H05K 3/04; H05K 3/107; H05K 3/28; H05K 1/0233; H05K 2201/0379; H05K 2201/0715; H05K 2201/09181; H05K 2201/09318; H05K 2201/096; H05K 2201/09618; H05K 2201/09718; H05K 3/403; H05K 3/4611; H05K 3/4623; H05K 1/0227; H05K 1/0239; H05K 1/0242; H05K 1/025; H05K 1/181; H05K 2201/0195; H05K 2201/09509; H05K 2203/061; H05K 3/46; H05K 3/4673; H05K 1/024; H05K 1/0289; H05K 1/16; H05K 2201/015; H05K 2201/0154; H05K 3/4688; H04B 1/3827; H04B 1/40; H04B 15/04; H04B 7/0482; H04B 7/0639; H04B 7/10; H04B 1/0064; H04B 10/69; H04B 1/16; H04B 1/1607; H04B 1/22

See application file for complete search history.

(56) References Cited

U.S. PATENT DOCUMENTS

| | | | |
|---|---|---|---|
| 7,956,708 B2 | 6/2011 | Bates et al. | |
| 9,490,768 B2 | 11/2016 | Randall et al. | |
| 10,547,096 B2 | 1/2020 | Bates | |
| 10,770,776 B2 | 9/2020 | Bates | |
| 11,108,158 B2 | 8/2021 | Bates | |
| 11,239,539 B1 | 2/2022 | Burdick et al. | |
| 11,355,827 B2 | 6/2022 | Dani | |
| 11,355,828 B2 | 6/2022 | Alton | |
| 11,431,067 B2 | 8/2022 | Burdick | |
| 11,469,486 B2 | 10/2022 | Nadeau | |
| 11,736,084 B2 | 8/2023 | Alton | |
| 2007/0182505 A1* | 8/2007 | Fujita | H01P 5/107 333/33 |
| 2008/0048796 A1* | 2/2008 | Shaul | H01P 3/003 333/4 |
| 2008/0297283 A1* | 12/2008 | Byun | H01P 5/107 333/21 R |
| 2021/0194512 A1* | 6/2021 | Clemente | H01Q 21/0018 |

* cited by examiner

MULTILAYER RADIO FREQUENCY COMPONENT

FIELD OF THE DISCLOSURE

The present disclosure relates generally to radio frequency (RF) components and more particularly to multilayer RF components comprising one or more planar transmission lines.

BACKGROUND

RF filters and other RF components are used pervasively in terrestrial and satellite communications, aerospace, avionics, radar, medical implants, automotive, and industrial applications among others requiring components that can be manufactured with precision and high yield, and in some applications with increasingly compact form-factors. Thus, there is an ongoing need for improvements in RF components.

BRIEF DESCRIPTION OF THE DRAWINGS

The objects, features and advantages of the present disclosure will become more fully apparent upon consideration of the following detailed description and appended claims in conjunction with the accompanying drawings. The drawings depict only representative embodiments and are not considered to limit the scope of the disclosure.

Those of ordinary skill in the art will appreciate that the figures are illustrated for simplicity and clarity and therefore may not be drawn to scale and may not include well-known features, that the order of occurrence of actions or steps may be different than the order described, that the order of occurrence of such actions or steps may be performed concurrently unless specified otherwise, and that the terms and expressions used herein have meaning understood by those of ordinary skill in the art except where a different meaning is specifically attributed to them herein.

DETAILED DESCRIPTION

The disclosure relates generally to multilayer radio frequency (RF) components comprising a planar transmission line on a dielectric substrate. In this specification, RF includes microwave frequencies. Such components can be configured as antennas, couplers, filters and power dividers, among other devices, and combinations thereof. Representative examples are described herein.

Figure 5:
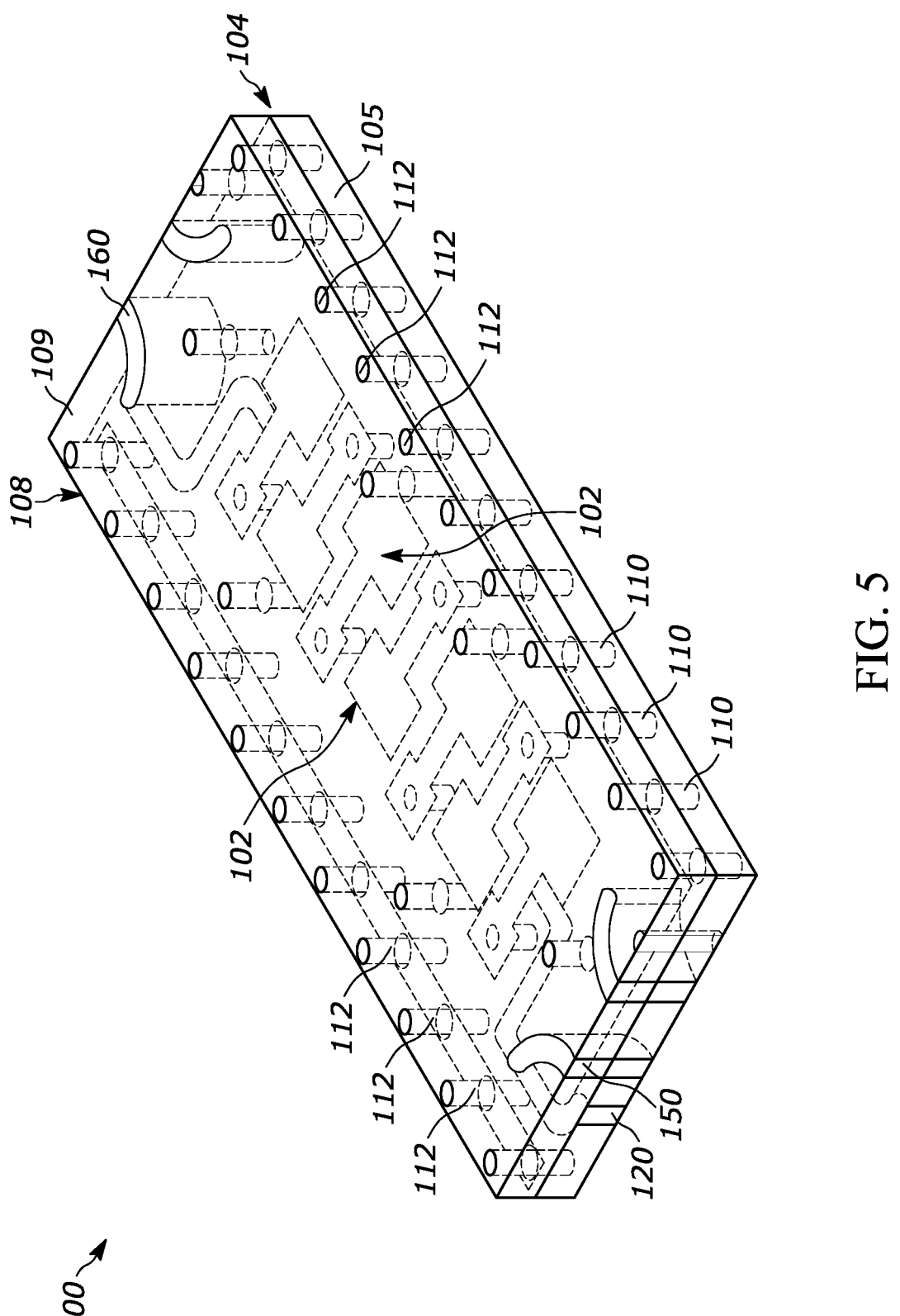
FIG. 5 is a top perspective phantom view revealing the interior of a multilayer RF component.
Figure 6:
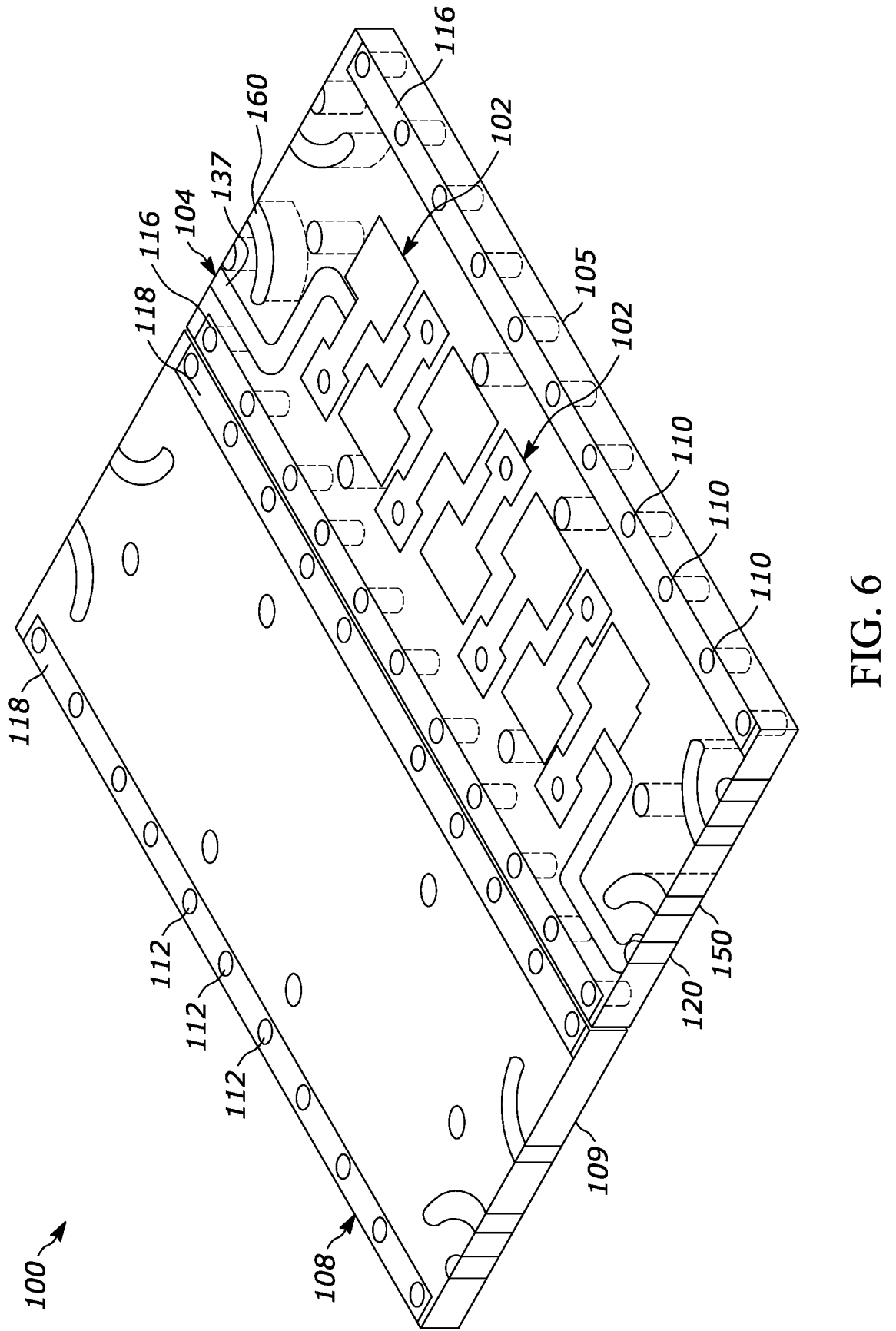
FIG. 6 is an unassembled perspective view of a multilayer RF component.

In FIGS. 1, 2, 3, 5 and 6, an RF component 100 comprises a planar transmission line located between an assembly of first and second dielectric substrates, at least one of which comprises a ground plane. In FIGS. 5 and 6, a planar transmission line 102 comprising multiple resonant elements is located on a first surface of a first dielectric substrate 104 and a ground plane is located on a second surface 105, opposite the first surface. A second dielectric substrate is 108 is assembled with the first dielectric substrate 104, wherein the planar transmission line 102 is located between the first and second dielectric substrates as best shown in FIG. 5. While the ground planes of the representative RF components are planar, the ground planes can assume non-planar shapes in other RF component implementations. The ground planes can be formed by depositing thin-film conductors on the dielectric substrates. Alternatively, for relatively low Q and low frequency applications, the ground planes can be implemented as thick-films or as conductors formed on FR-4 or other circuit boards.

In some implementations, the planar transmission line is at least partially shielded from electromagnetic interference. For this purpose, the first dielectric substrate can comprise a first conductive shield portion and the second dielectric substrate can comprise a second conductive shield portion, wherein the first and second conductive shield portions are electrically connected to a ground plane and arranged at least partially about the planar transmission line located between the first and second dielectric substrates.

Figure 7:
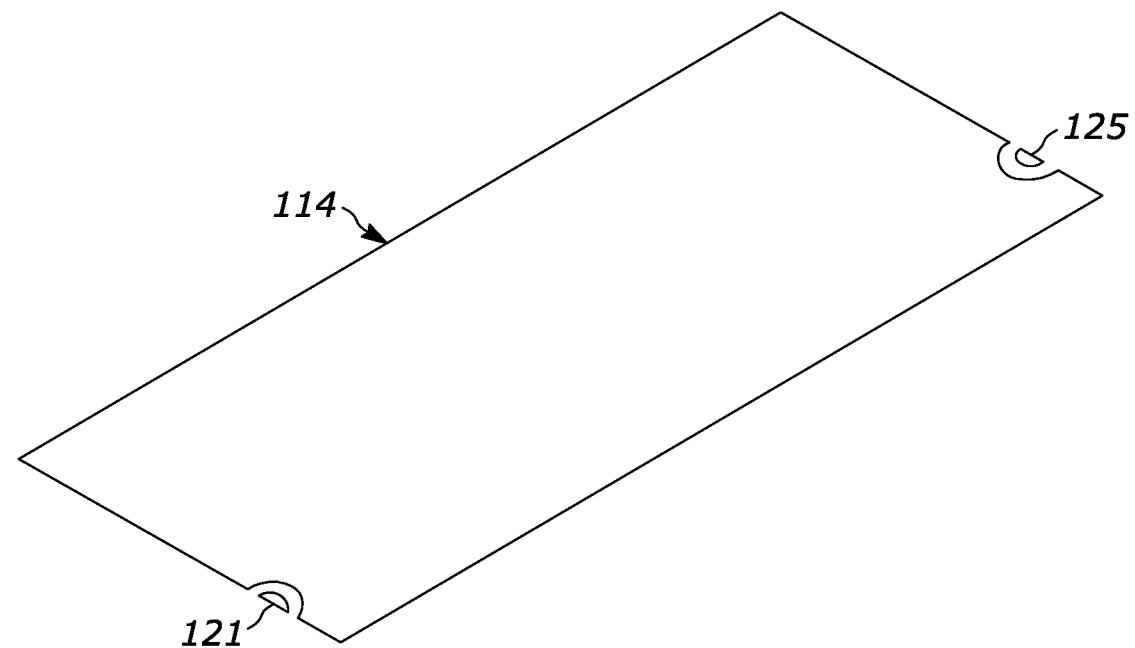
FIG. 7 is a perspective view of a ground plane for a multilayer RF component.

In FIGS. 5 and 6, the first conductive shield portion comprises a first plurality of conductive vias 110 integrated with the first dielectric substrate 104, and the second conductive shield portion comprises a second plurality of conductive vias 112 integrated with the second dielectric substrate 108. The first and second pluralities of vias are located and arranged along opposite lateral sides of the corresponding first and second dielectric substrates. Vias of the first plurality of vias are aligned with, and electrically connected to, corresponding vias of the second plurality of vias. The first plurality of vias 110 are electrically connected to the ground plane located on the surface 105 of the dielectric substrate 104. In implementations that include an optional second ground plane located on a surface 109 of the second dielectric substrate 108, the second plurality of vias 112 are electrically connected to the second ground plane. The vias can be formed by applying thin-film conductors to apertures in the dielectric substrates. Alternatively, the first and second conductive shield portions can comprise thin-film conductors deposited on side walls of the first and second dielectric substrates in lieu of vias. FIG. 7 illustrates a representative ground plane 114, in isolation, suitable for location on the surface 105 of the first dielectric substrate 104 and on the surface 109 of the second dielectric substrate 108 in implementations that include a second ground plane.

In some implementations, a first conductive flange located on a surface of the first dielectric substrate, facing the second dielectric substrate, is electrically connected to the first conductive shield portion and a second conductive flange located on a surface of the second dielectric substrate, facing the first dielectric substrate, is electrically connected to the second conductive shield portion, wherein the first conductive flange is electrically connected to the second conductive flange.

In FIG. 6, the first conductive flange is a first conductive strip 116 electrically connected to the first plurality of vias 110, and the second conductive flange is a second conductive strip 118 electrically connected to the second plurality of vias 112. In alternative implementations, the first and second and conductive flanges or strips can be electrically connected to corresponding first and second conductors applied to side walls of the first and second substrates (in lieu of the plurality of vias) as described herein. The conductive flanges can be fabricated as thin-films deposited on the respective substrates as described herein. Upon assembly of the first and second dielectric substrates, the first and second conductive strips are electrically connected by physical contact. In some implementations, the first and second strips can be electrically connected by an interconnecting conductive material like conductive adhesive, paste or epoxy, or solder. Alternatively, the conductive strips can be retained in direct frictional contact in the absence of a conductive material by otherwise mechanically fastening the first and second substrates together.

The RF component generally comprises input and output interfaces electrically coupled to the one or more planar transmission lines. In some implementations, the RF component is configured for surface-mount technology. The input interface can comprise an input via extending from an input via-flange located, and spaced apart from the ground plane, on the surface of the first dielectric substrate. Similarly, the output interface can comprise an output via extending from an output via-flange located, and spaced apart from the ground plane, on the surface of the first dielectric substrate.

In FIGS. 5 and 6, an input via 120 is electrically coupled to the planar transmission line 102 and comprises an input via-flange located on the surface 105 in spaced apart relation to the ground plane. In FIG. 6, an output via 137 is electrically coupled to the planar transmission line 102 and comprises an output via-flange located on the surface 105 in spaced apart relation to the ground plane. The input and output vias can be located on opposite ends of the planar transmission line. FIG. 7 shows an input via-flange 121 of the input via and output via-flange 125 of the output via, both of which are physically and electrically isolated from the ground plane 114. The input and output via-flanges can have a diameter greater than a diameter of the corresponding input and output vias to facilitate mounting to conductive strips or pads. When the ground plane 114 of FIG. 7 is located on the surface 105 of the first dielectric substrate 104 of FIG. 6, the input via-flange 121 is electrically connected to the input via 120 and the output via-flange 125 is electrically connected to the output via 137. Alternatively, the input and output interfaces of the multilayer RF component can be configured for epoxy mounting and wire-bond circuit integration. Wire-bond interfaces can be implemented as contacts or pads on the RF component to which conductors can be wire-bonded in lieu of input and output vias and via-flanges.

In some implementations, the one or more planar transmission lines are electromagnetically shielded by input and output via-shields. More specifically, an input via-shield electrically connected to the ground plane can be located between the input via and the planar transmission line, and an output via-shield electrically connected to the ground plane can be located between the output via and the planar transmission line. The input and output via-shields can be disposed at least partially about the corresponding input and output vias for better isolation. The via-shields generally improve RF isolation between the input and output vias. The via-shields can also reduce cross interference between multiple input vias and between multiple output vias in implementations where multiple RF components are stacked one upon the other as described further herein.

In FIG. 6, an input via-shield 150 is located between the input via 120 and the planar transmission line 102 and an output via-shield 160 is located between the output via 137 and the planar transmission line 102. The input via-shield and the output via-shield are both electrically connected to the ground plane on the surface 105 of the first dielectric substrate 104. The input and output via-shields can each comprise a first via-shield portion integrated with the first dielectric substrate and a second via-shield portion integrated with the second dielectric substrate, wherein the via-shield portions are electrically connected by corresponding conductive flanges at the interface between the first and second dielectric substrates, similar to the conductive flanges interconnecting the first and second conductive shields. In some implementations, optionally, a second ground plane can be located on the outer surface of the second dielectric substrate, wherein the input and output via-shields are electrically connected to the second ground plane. The input and output via-shields, and corresponding conductive flanges if any, can be formed by depositing a thin-film conductor on surfaces cut, routed or otherwise formed in or on the corresponding substrates.

In one implementation, the RF component comprises a first dielectric substrate comprising a planar transmission line on a first surface and a first ground plane on a second surface, opposite the first surface, of the first dielectric substrate. A second dielectric substrate comprises a first surface facing the first surface of the first dielectric substrate, wherein the planar transmission line is located between the first and second dielectric substrates. A first plurality of conductive vias integrated with the first dielectric substrate are electrically connected to the ground plane and to a second plurality of conductive vias integrated with the second dielectric substrate, wherein the electrically connected conductive vias are arranged at least partially about the planar transmission line. In some implementations, a first conductive strip located on the first surface of the first dielectric and electrically connected to the first plurality of vias is electrically connected to a second conductive strip located on the first surface of the second dielectric material and electrically connected to the second plurality of vias. In some implementations, an electrically conductive material interconnects the first and second conductive strips, examples of which are described herein. In surface mount implementations, the RF component can comprise input and output vias as described herein.

Generally, the RF component can comprise two or more multilayer RF components stacked one upon the other, wherein adjacent RF components are separated by a ground plane. At least one of the stacked RF components comprises a planar transmission line located between first and second dielectric substrates, one of which includes a first ground plane as described herein. Thus, two or more multilayer filter components can be stacked to form an integrated bank of discrete or interconnected RF components. The two or more multilayer RF components can perform the same or different functions and each can have corresponding separate input and output interfaces. Alternatively, the two or more multilayer RF components can be electrically connected in parallel or in series by integrated vias or other conductors. For example, two or more stacked RF filter components can be electrically interconnected to form a single higher order filter, wherein the stacked RF component comprises only a single set of input and output interfaces for the serially or parallel connected filters.

Figure 1:
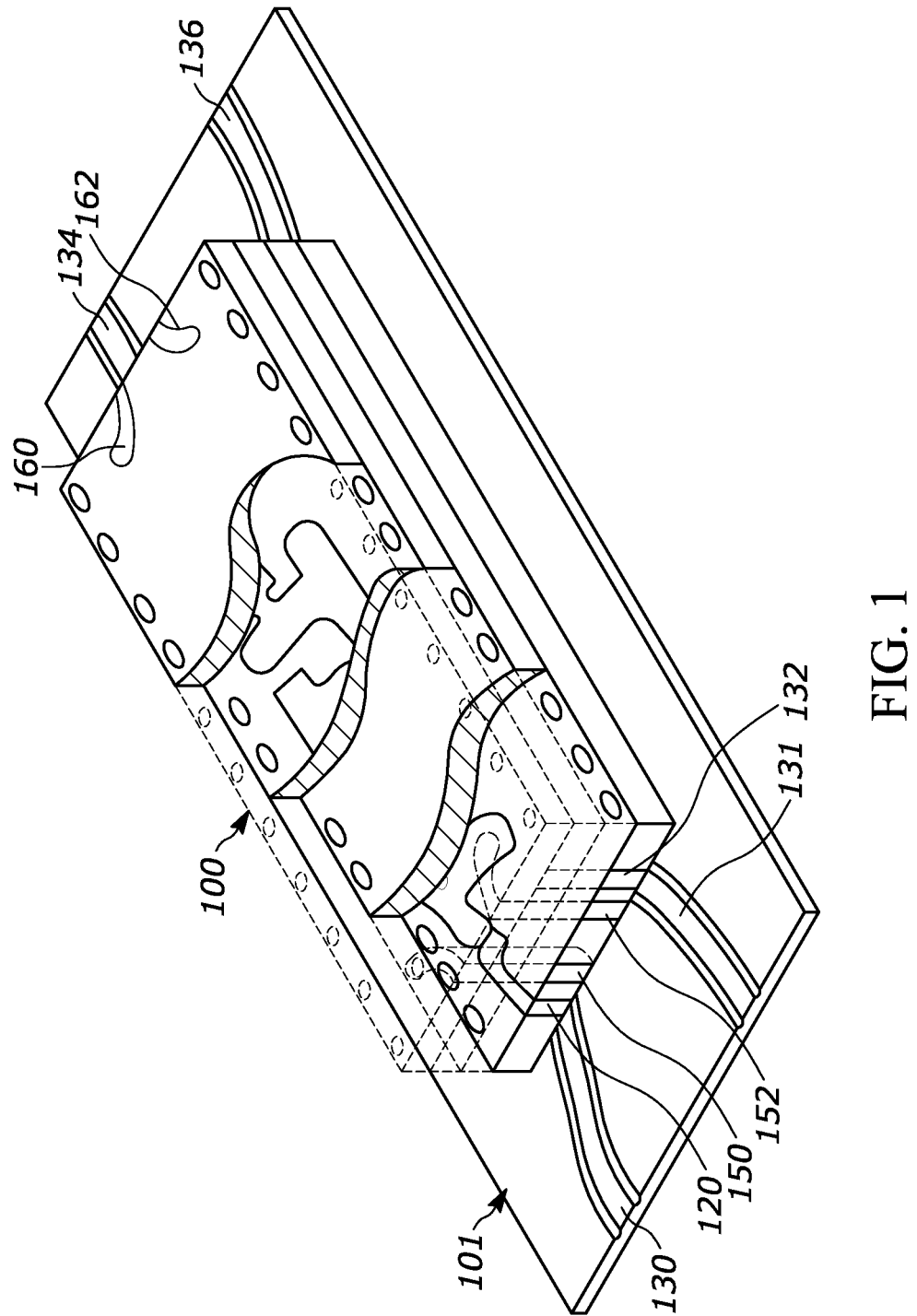
FIG. 1 is a perspective phantom view of a multilayer RF component surface mounted on a circuit board.
Figure 2:
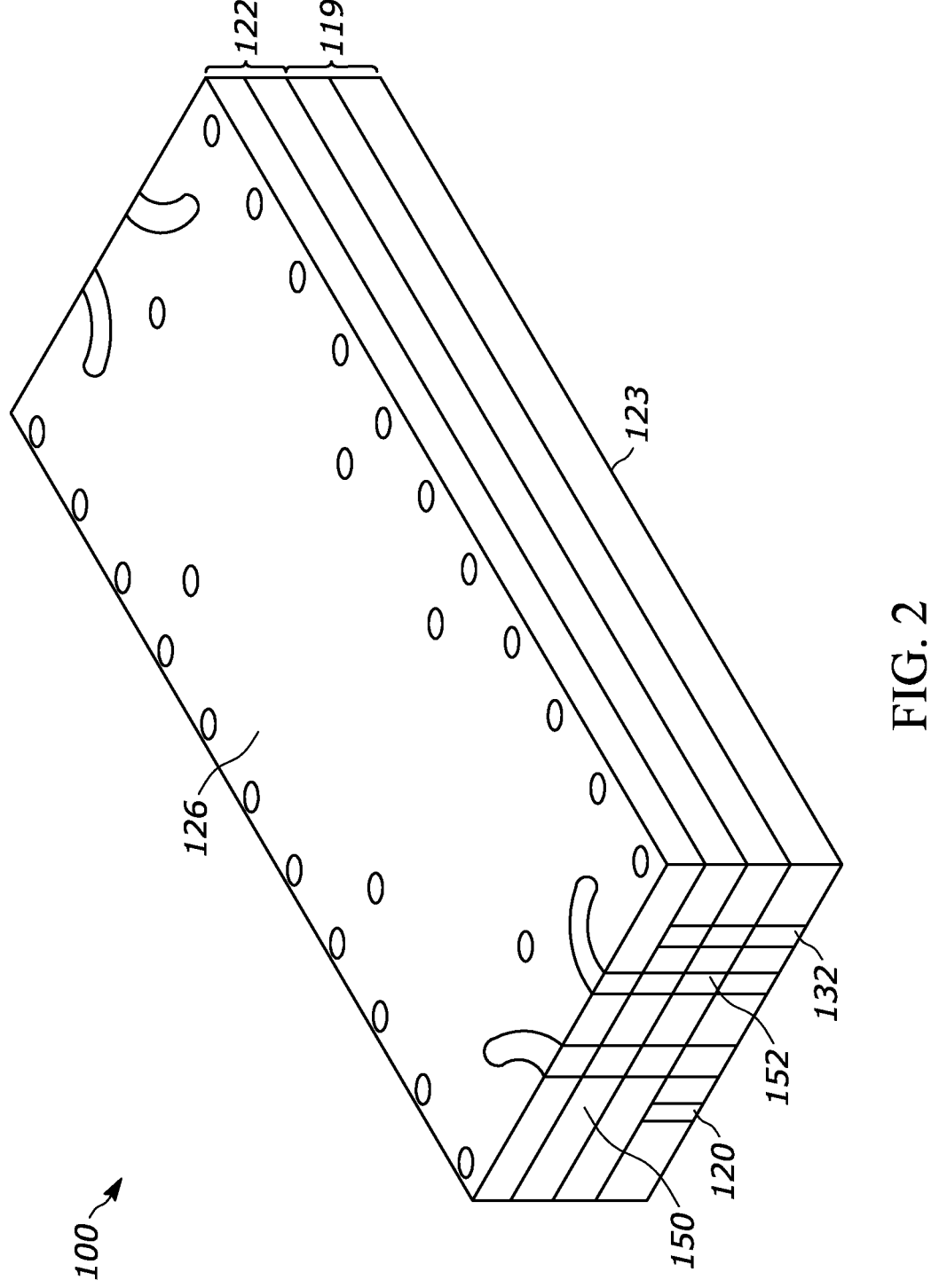
FIG. 2 is a top perspective view of a multilayer RF component.
Figure 3:
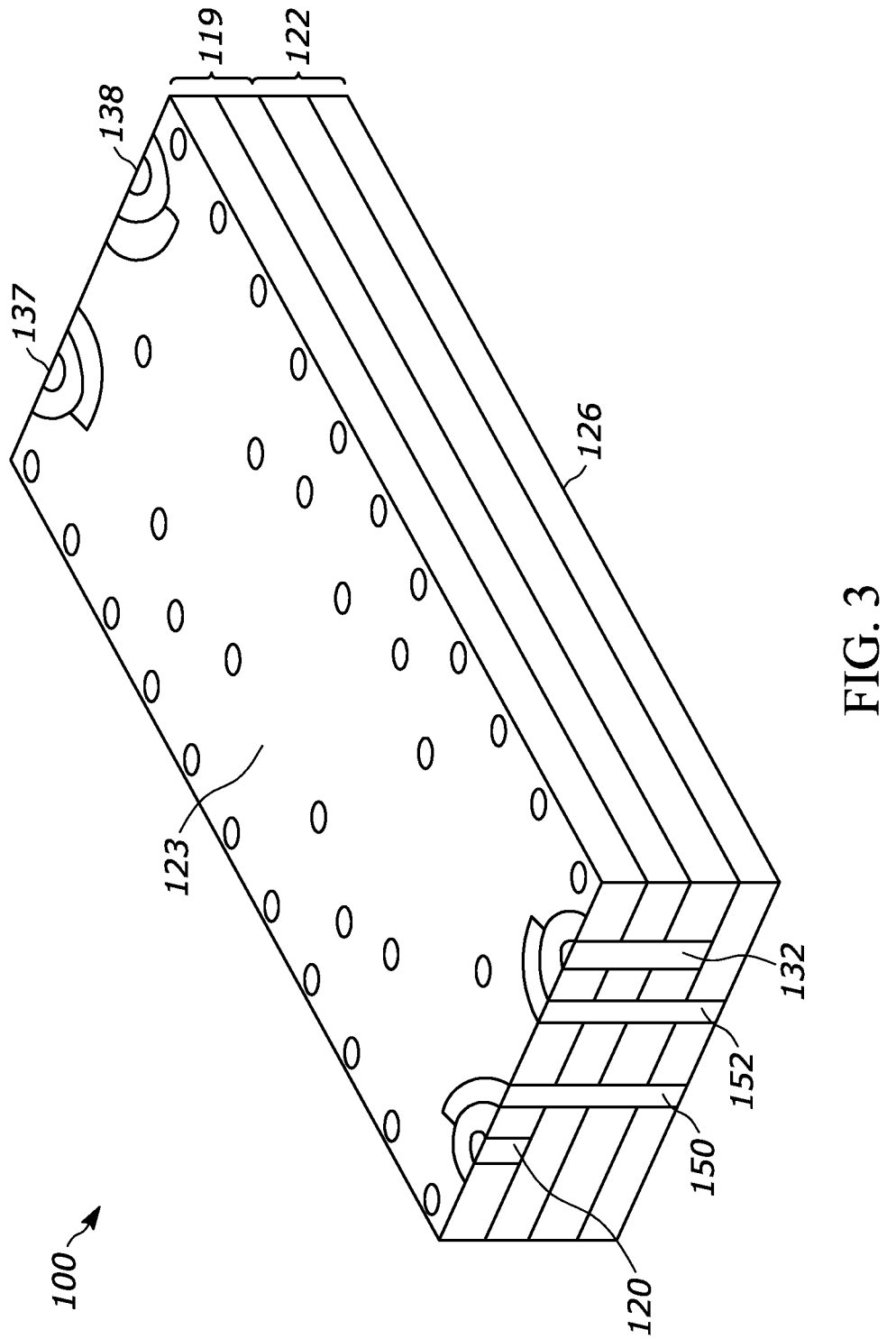
FIG. 3 is a bottom perspective view of the multilayer RF component of FIG. 2.
Figure 4:
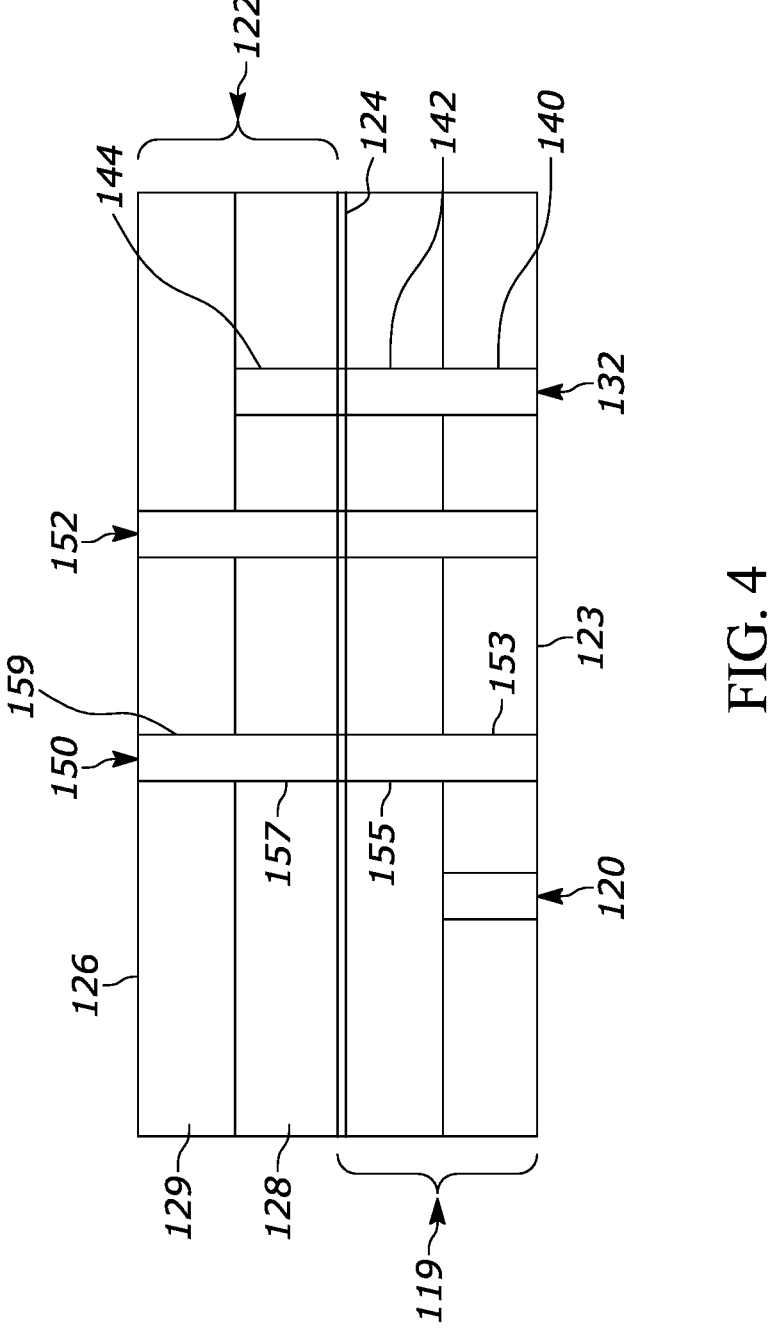
FIG. 4 is an end view of a multilayer RF component.

In FIGS. 2-4, a first RF component 119 comprises a first planar transmission line located between first and second dielectric substrates, one of which includes a first ground plane 123. A second RF component 122 is stacked relative to, and separated from, the first RF component 119 by a second ground plane 124 shown in FIG. 4. The second RF component 122 comprises a second planar transmission line located between first and second dielectric substrates, one of which optionally includes a third ground plane 126. The two or more ground planes can be electrically connected by vias or other conductive portions as described herein. In FIGS. 1-4, the first and second multilayer RF components each comprise a corresponding plurality of electrically connected vias or other conductive shield portions arranged at least partially about the corresponding first and second planar transmission lines as described above in connection with FIGS. 5 and 6. The connected vias are electrically connected to the ground planes to shield the planar transmission lines from electromagnetic interference. In some implementations, more generally, the second RF component 122 can be devoid of the third ground plane 126 shown in FIG. 2. The second RF component can also be devoid of a dielectric substrate 129 (shown in FIG. 4) covering the second planar transmission line located on a first dielectric substrate 128.

In FIG. 1, an RF component 100 comprising first and second stacked multilayer RF components is a surface mount device (SMD) configured for mounting on a circuit board 101. The RF component comprises first input via 120 electrically interconnecting a first conductor 130 of the circuit board and a first planar transmission line, and a second input via 132 electrically interconnecting a second conductor 131 of the circuit board and a second planar transmission line. In FIG. 4, the second input via 132 comprises electrically connected via-portions 140, 142 and 144 integrated with corresponding dielectric substrates of the first and second RF components 119 and 122. The via-portion 140 is electrically connected to the ground plane 123 and the via-portion 144 is electrically coupled to the second planar transmission line. The via-portions 140, 142 and 144 can comprise conductive flanges to facilitate electrical contact using a conductive material upon assembly of the RF components as described herein. The second ground plane 124 can interconnect via-portions 142 and 144.

In FIG. 1, the RF component also comprises a first output via electrically interconnecting a third circuit board conductor 134 and the first planar transmission line, and a second output via electrically interconnecting a fourth circuit board conductor 136 and the second planar transmission line. FIG. 3 shows the first output via 137 and the second output via 138, both of which are configured similar to the first and second input vias 120 and 132 shown in FIG. 4. The output vias can include via-flanges separated and electrically isolated from the ground plane 123.

In FIG. 1, the RF component comprises a first input via-shield 150 electrically connected to the first ground plane and located at least partially between the first input via 120 and the first planar transmission line, and a second input via-shield 152 electrically connected to the first ground plane and located at least partially between the second input via 132 and the second planar transmission line. In FIG. 4, the first input via-shield 150 comprises electrically connected via-shield portions 153, 155, 157 and 159 integrated with corresponding dielectric substrates of the first and second RF components 119 and 122. The via-shield portion 153 is electrically connected to the ground plane 123 and the via-shield portion 159 is electrically connected to the third ground plane 126. The second ground plane 124 can interconnect via-shield portions 153 and 155. The via-shield portions 153, 155, 157 and 159 can comprise conductive via-flanges on surfaces of the dielectric substrates to facilitate electrical contact with neighboring via-flanges or ground planes upon assembly of the RF components as described herein. The second input via-shield 152 can also comprise multiple via-shield portions and be configured like the first input via-shield.

In FIG. 1, the RF component comprises a first output via-shield 160 electrically connected to the first ground plane and located at least partially between the first output via and the first planar transmission line, and a second output via-shield 162 electrically connected to the first ground plane and located at least partially between the first and second output vias and the second planar transmission line. The first and second output via-shields each comprise electrically connected via-shield portions integrated with corresponding dielectric substrates of the first and second RF components like the input via-shields 150 and 152 illustrated in FIG. 4 and described herein. The input and output via-shields, and corresponding via-flanges if any, can be formed by depositing thin-film conductors on surfaces cut, routed or otherwise formed in or on the corresponding dielectric substrates.

In one implementation, a radio frequency (RF) component comprises a first RF component comprising a planar transmission line between first and second dielectric substrates, and a second RF component stacked relative to the first RF component. The first planar transmission line is located between a first ground plane on a first surface of the first RF component and a second ground plane between the first and second RF components, wherein the first and second ground planes are electrically connected. The first dielectric substrate can comprise a first conductive shield portion electrically connected to a second conductive shield portion of the second dielectric substrate, wherein the electrically connected first and second conductive shield portions are arranged at least partially about the planar transmission line. The first and second conductive shield portions can be implemented as first and second pluralities of vias integrated with the corresponding first and second dielectric substrates. The first and second pluralities of vias can be electrically connected to corresponding conductive strips on corresponding surfaces of the dielectric substrates as described herein, wherein the first and second conductive strips are electrically connected by direct contact or an electrically conductive material upon assembly or the substrates as described herein.

The one or more planar transmission lines can be implemented as a microstrip, stripline, coplanar waveguide or other type of impedance-controlled transmission line comprising a conductive film patterned or otherwise formed as a distributed-element circuit on a dielectric substrate. The distributed-element circuit can be configured as one or more resonant elements and other structures that perform various electrical functions through appropriate patterning of the conductive film. Distributed-element circuits for antennas, couplers, filters and power dividers, among other devices are well known generally to those of ordinary skill in the art and are not described further herein. The RF components described herein can be manufactured with precision, high yield and at low cost by depositing the distributed-element circuits and other conductors on dielectric substrates as thick or thin films.

High Q and low loss RF components with operating frequencies from DC to over 50 GHz or more can be realized using ceramics and other dielectric materials having a high relative permittivity, $\varepsilon_r$. Representative ceramic materials include, among others, aluminum oxide and aluminum nitride ($\varepsilon_r$ between about 8 and 100), strontium titanate ($\varepsilon_r$ of about 310), barium titanate ($\varepsilon_r$ of about 500), and barium strontium titanate ($\varepsilon_r$ between about 1,200 and 10,000). Ceramics also have good temperature stability, from as low as −55° C. to as high as 125° C. Additionally, properties of ceramics permit construction of RF filters and other RF components that are physically smaller than the signal's wavelength in free space. Thin-film ceramic RF components described herein can be fabricated with small footprints having an area between 1 mm$^2$ and 100 mm$^2$ suitable for use in small-scale RF systems, devices and subassemblies. Such thin-film ceramic RF components can comprise a Q factor between 50 and 300 and an insertion loss between 0.5 dB and 6 dB.

Alternatively, the dielectric substrate can comprise Rogers PCB material, silicon, quartz, glass and conventional epoxy resin PCB board (e.g., FR-4), among other dielectrics. But these and other dielectrics generally have lower relative permittivity and less temperature stability than ceramics. For example, silicon has a relative permittivity of about 11.68, and FR-4 has a relative permittivity of about 4.4. Thus FR-4 and other dielectric materials may not be suitable for use in applications with relatively high Q requirements and operational frequencies above 1 GHz. Also, an RF component comprising a ceramic dielectric can be up to 20 times smaller than an RF component comprising FR-4.

Conductors can be deposited on dielectric substrates using various deposition processes and techniques. Thin-films can be deposited using vapor deposition and photolithographic patterning techniques. Vapor deposition includes physical vapor deposition (PVD), also known as sputtering, and various chemical vapor deposition (CVD) processes. Thin-film planar transmission lines and other conductors (e.g., ground planes, shields, vias, flanges, interface pads, etc.) have a thickness typically ranging from fractions of a nanometer to several micrometers, more or less.

Alternatively, in lieu of thin-film technology, the conductors can be fabricated as thick-films deposited on dielectric substrates using screen printing techniques or as conductive traces printed or etched on circuit boards like FR-4. However, PVD and other vapor deposition processes permit fabrication of smaller structures than thick-film processes. Vapor deposition processes also provide more precise patterning with tighter tolerances and less product variation, thus eliminating or substantially reducing the need for tuning the RF component, compared to thick-film process and printed circuit board (PCB) fabrication techniques. Thick-films have a typical thickness between 0.0001 mm and 0.1 mm, more or less. Traces on FR-4 are thicker still. Nevertheless, the multilayer RF components described herein can be fabricated using thick-film processes and PCB technology on dielectric substrates other than ceramic for some applications.

While the disclosure and what is presently considered to be the best mode thereof has been described in a manner establishing possession and enabling those of ordinary skill in the art to make and use the same, it will be understood and appreciated that there are many equivalents to the representative embodiments described herein and that myriad modifications and variations may be made thereto without departing from the scope and spirit of the invention, which is to be limited not by the embodiments described but by the appended claims and their equivalents.

What is claimed is:

1. A radio frequency (RF) component comprising:
a first RF component comprising a first planar transmission line disposed between first and second dielectric substrates;
a first ground plane on a first surface of the first RF component;

a second RF component comprising a second planar transmission line disposed between third and fourth dielectric substrates;
the second RF component stacked with the first RF component;
a second ground plane disposed between the first and second RF components, the second ground plane electrically connected to the first ground plane, the first planar transmission line located between the first and second ground planes; and
a third ground plane disposed adjacent a surface of the second RF component and electrically connected to the second ground plane, the second planar transmission line located between the second and third ground planes.

2. The RF component of claim 1,
the first dielectric substrate comprising a first conductive shield portion, and the second dielectric substrate comprising a second conductive shield portion, the first conductive shield portion electrically connected to the second conductive shield portion, the electrically connected first and second conductive shield portions interconnecting the first and second ground planes and arranged at least partially about the first planar transmission line;
the third dielectric substrate comprising a third conductive shield portion, and the fourth dielectric substrate comprising a fourth conductive shield portion, the third conductive shield portion electrically connected to the fourth conductive shield portion, the electrically connected third and fourth conductive shield portions interconnecting the second and third ground planes and arranged at least partially about the second planar transmission line.

3. The RF component of claim 2 further comprising:
a first conductive strip located on a surface of the first dielectric substrate facing the second dielectric substrate and electrically connected to the first conductive shield portion;
a second conductive strip located on a surface of the second dielectric substrate facing the first dielectric substrate and electrically connected to the second conductive shield portion, the first conductive strip electrically connected to the second conductive strip;
a third conductive strip located on a surface of the third dielectric substrate facing the fourth dielectric substrate and electrically connected to the third conductive shield portion;
a fourth conductive strip located on a surface of the fourth dielectric substrate facing the third dielectric substrate and electrically connected to the fourth conductive shield portion, the third conductive strip electrically connected to the fourth conductive strip.

4. The RF component of claim 3,
the first conductive shield portion comprising a first plurality of conductive vias integrated with the first dielectric substrate, and the second conductive shield portion comprising a second plurality of conductive vias integrated with the second dielectric substrate;
the third conductive shield portion comprising a third plurality of conductive vias integrated with the third dielectric substrate, and the fourth conductive shield portion comprising a fourth plurality of conductive vias integrated with the fourth dielectric substrate.

5. The RF component of claim 4 further comprising an electrically conductive material interconnecting the first and second conductive strips, the electrically conductive material interconnecting the third and fourth conductive strips.

6. The RF component of claim 1 further comprising:
a first input via extending from a first input via-flange on the first surface of the first RF component and electrically coupled to the first planar transmission line, the first input via-flange spaced apart from the first ground plane;
a first input via-shield electrically connected to the first ground plane and located between the first input via and the first and second planar transmission lines;
a first output via extending from a first output via-flange on the first surface of the first RF component and electrically coupled to the first planar transmission line, the first output via-flange spaced apart from the first ground plane;
a first output via-shield electrically connected to the first ground plane and located between the first output via and the first and second planar transmission lines;
a second input via extending from a second input via-flange on the first surface of the first RF component and electrically coupled to the second planar transmission line, the second input via-flange spaced apart from the first ground plane;
a second input via-shield electrically connected to the first ground plane and located between the second input via and the first and second planar transmission lines;
a second output via extending from a second output via-flange on the first surface of the first RF component and electrically coupled to the second planar transmission line, the second output via-flange spaced apart from the first ground plane; and
a second output via-shield electrically connected to the first ground plane and located between the second output via and the first and second planar transmission lines.

7. The RF component of claim 1 is a thin-film RF component, each of the first and second planar transmission lines are microstrips comprising one or more resonant elements, and the first, second, third and fourth dielectric substrates comprise ceramic.

8. A radio frequency (RF) component comprising:
a first RF component comprising a planar transmission line between first and second dielectric substrates;
a first ground plane on a first surface of the first RF component;
a second RF component stacked relative to a second surface, opposite the first surface, of the first RF component;
a second ground plane between the first and second RF components, the second ground plane electrically connected to the first ground plane, wherein the planar transmission line is located between the first and second ground planes,
the first dielectric substrate comprising a first conductive shield portion; and
the second dielectric substrate comprising a second conductive shield portion,
the first conductive shield portion electrically connected to the second conductive shield portion and to the first ground plane, the electrically connected first and second conductive shield portions arranged at least partially about the planar transmission line.

9. The RF component of claim 8 further comprising:
a first conductive strip located on a surface of the first dielectric substrate facing the second dielectric substrate, the first conductive strip electrically connected to the first conductive shield portion;
a second conductive strip located on a surface of the second dielectric substrate facing the first dielectric substrate, the second conductive strip electrically connected to the second conductive shield portion,
the first conductive strip electrically connected to the second conductive strip.

10. The RF component of claim 9,
the first conductive shield portion comprising a first plurality of conductive vias integrated with the first dielectric substrate,
the second conductive shield portion comprising a second plurality of conductive vias integrated with the second dielectric substrate.

11. The RF component of claim 9 further comprising an electrically conductive material interconnecting the first and second conductive strips.

12. The RF component of claim 10 is a surface mount device further comprising:
a first input via extending from a first input via-flange on the first surface of the first RF component and electrically coupled to the planar transmission line, the first input via-flange spaced apart from the first ground plane;
a first input via-shield electrically connected to the first ground plane and located between the first input via and the planar transmission line;
a first output via extending from a first output via-flange on the first surface of the first RF component and electrically coupled to the planar transmission line, the first output via-flange spaced apart from the first ground plane; and
a first output via-shield electrically connected to the first ground plane and located between the first output via and the planar transmission line.

13. The RF component of claim 12,
the first input via-shield electrically connected to the second ground plane; and
the first output via-shield electrically connected to the second ground plane.

14. The RF component of claim 8 is a thin-film device, the planar transmission line is a microstrip comprising one or more resonant elements, and the first and second dielectric substrates comprise ceramic.

15. A thin-film radio frequency (RF) component comprising:
a first dielectric substrate comprising a planar transmission line at a first surface of the first dielectric substrate and a first plurality of conductive vias;
a first ground plane at a second surface, opposite the first surface, of the first dielectric substrate, the first plurality of conductive vias electrically connected to the first ground plane;
a second dielectric substrate comprising a second plurality of conductive vias, a first surface of the second dielectric substrate facing the first surface of the first dielectric substrate, the planar transmission line located between the first and second dielectric substrates;
the first plurality of conductive vias electrically connected to the second plurality of conductive vias and the electrically connected conductive vias arranged at least partially about the planar transmission line;
an input electrically coupled to the planar transmission line;
an output electrically coupled to the planar transmission line.

16. The RF component of claim 15 further comprising, a first conductive strip on the first surface of the first dielectric substrate and electrically connected to the first plurality of conductive vias, a second conductive strip on the first surface of the second dielectric substrate and electrically connected to the second plurality of conductive vias, the first conductive strip electrically connected to the second conductive strip.

17. The RF component of claim 15 is a surface mount device further comprising:

a second ground plane on a second surface, opposite the first surface, of the second dielectric substrate, the second plurality of conductive vias electrically connected to the second ground plane;

an input via extending from an input via-flange on the second surface of the first dielectric substrate and electrically coupled to the planar transmission line, the input via-flange spaced apart from the first ground plane;

an input via-shield electrically connected to the first ground plane, the input via-shield and located between the input via and the planar transmission line;

an output via extending from an output via-flange on the second surface of the first dielectric substrate and electrically coupled to the planar transmission line, the output via-flange spaced apart from the first ground plane; and an output via-shield electrically connected to the first ground plane, the output via-shield located between the output via and the planar transmission line.

18. The RF component of claim 17 further comprising, a first conductive strip on the first surface of the first dielectric substrate and electrically connected to the first plurality of conductive vias, a second conductive strip on the first surface of the second dielectric substrate and electrically connected to the second plurality of conductive vias, the first conductive strip electrically connected to the second conductive strip by a conductive adhesive.

19. The RF component of claim 17, the first planar transmission line comprising one or more resonant elements, and the first and second dielectric substrates comprising ceramic.

20. The RF component of claim 16, wherein the first conductive strip is electrically connected to the second conductive strip by an electrically conductive material.

\* \* \* \* \*